US006639624B1

(12) United States Patent
Bachelder et al.

(10) Patent No.: US 6,639,624 B1
(45) Date of Patent: Oct. 28, 2003

(54) MACHINE VISION METHODS FOR INSPECTION OF LEADED COMPONENTS

(75) Inventors: Ivan Bachelder, Newton, MA (US);
Karen Roberts, Natick, MA (US);
Aaron Wallack, Natick, MA (US);
William Silver, Weston, MA (US);
Edward Collins, Smithfield, RI (US);
Karen Sarachik, Newtonville, MA (US)

(73) Assignee: Cognex Corporation, Natick, MA (US)

( * ) Notice: Subject to any disclaimer, the term of this patent is extended or adjusted under 35 U.S.C. 154(b) by 0 days.

(21) Appl. No.: 09/547,590

(22) Filed: Apr. 11, 2000

Related U.S. Application Data

(63) Continuation of application No. 09/476,179, filed on Dec. 30, 1999, now abandoned.

(51) Int. Cl.[7] .................................................. H04N 7/18
(52) U.S. Cl. .............................. 348/87; 348/94; 348/95; 348/126; 348/129; 348/130
(58) Field of Search ....................... 348/86–95, 125–134

(56) References Cited

U.S. PATENT DOCUMENTS

| 5,739,846 A | * | 4/1998 | Gieskes | 348/87 |
| 6,118,540 A | * | 9/2000 | Roy et al. | 348/126 |
| 6,141,040 A | * | 10/2000 | Toh | 348/126 |
| 6,188,784 B1 | * | 2/2001 | Linker, Jr. | 348/87 |

\* cited by examiner

*Primary Examiner*—Andy Rao
(74) *Attorney, Agent, or Firm*—David J. Powsner

(57) ABSTRACT

A machine vision method for locating a leaded electronic device, such as integrated circuit chips, includes searching the image with a template depicting only a portion—e.g., one or two "side" edges—of each of one or more of the leads expected on the device. The template can include portions representing expected leads, as well as unexpected leads or unexpected lead positions. Positive and negative weightings are applied to such portions, as appropriate. A location of the device, or of one or more of its leads, is based on the results of the search.

33 Claims, 3 Drawing Sheets

MACHINE VISION METHODS FOR INSPECTION OF LEADED COMPONENTS

This application is a continuation of and claims the benefit of priority of U.S. Ser. No. 09/476,179, filed Dec. 30, 1999, now abandoned entitled "MACHINE VISION METHODS FOR INSPECTION OF LEADED COMPONENTS".

BACKGROUND OF THE INVENTION

The invention pertains to machine vision and, more particularly, to methods for locating electronic components with leads.

Machine vision refers to the automated analysis of an image to determine characteristics of objects and other features shown therein. It is often employed in automated manufacturing, where images of components are analyzed to determine placement and alignment prior to assembly.

During the assembly of electronic devices, machine vision is used to determine the position and orientation of leaded components before they are soldered onto printed circuit boards. Analysis of leaded component images is often accomplished in two passes: a first to determine approximate position and orientation; and, a second to determine these more exactly, as well as, where necessary, to inspect the component, e.g., for defects. According to one general practice, at least the first pass is accomplished by scanning the images for edge boundaries—specifically, those corresponding to transitions between the component body and its leads, or between the leads and the image background.

One advanced technique using this practice is described in U.S. Pat. No. 5,805,222, which is owned by the assignee hereof. That patent discloses a method that includes estimating the location of a group of leads, computing the center and angle of a "lead scan search" rectangle within which the group of leads is located, scanning that rectangle to locate lead tips and bases, and updating an estimate of the group's location. These steps are repeated for each group of leads so that their positions can be accurately determined and so that they can be appropriately inspected.

Though overcome by the above-cited patent, complications can arise when inspecting leaded component images for lead/body or lead/background transitions. For example, there is often a wide variation in the intensity of light reflected off the leads. Sometimes the "feet" or tips of the leads are not visible in the image, while at other times they are the only portions present. Still other times, each lead appears as two or more bright reflective "blobs". The complications are exacerbated when the image background contains excessive noise in the area around the leads.

Other prior art techniques for approximating the location of component leads rely heavily on machine vision "search" techniques, i.e., techniques that search image under inspection to find the portion that best matches a template (or model) image. The template for leaded component inspection would typically comprise in image of the entire component.

Search-based techniques for finding leaded components have met with limited success. This is partly due to the large variation in imaging conditions described above. It is also due to the differences between the model image and actual lead set geometries, dimensions, pitch distances, etc., in images under inspection.

An object of this invention is to provide improved methods for machine vision and, more particularly, improved methods for inspection of electronic leaded components.

A further object of the invention is to provide such methods as permit the rapid determination of leaded component position, orientation, pose, and/or scale (hereinafter, unless otherwise evident from context, collectively referred to as "location").

A related object is to provide such methods as can be used for purposes of approximation of leaded component location or, where appropriate, final determination thereof.

A further object of the invention is to provide such methods as can be implemented in conventional machine vision apparatus, without undue expense or consumption of resources.

SUMMARY OF THE INVENTION

The foregoing are among the objects achieved by the invention, which provides in one aspect a machine vision method for locating a leaded electronic device, such as integrated circuit chips, in an image. The method includes searching the image with a template depicting only a portion of each of one or more of the leads expected on the device. A location (i.e., a position, orientation, pose and/or scale) of the device, or its leads, follows from results of the search.

According to one related aspect of the invention, the searched-for templates represent no more than two edges of each of the expected leads. For example, the method can use a pattern that represents the left and right "side" edges of each lead, but not its "tip" or "base" edges. Such a pattern can be advantageously used with devices having relatively few leads, e.g., ten or fewer leads, five or fewer leads, or, preferably, three or fewer leads. It can otherwise be advantageously used with devices whose leads are substantially spaced from one another, e.g., devices for which (i) the lead pitch is greater than or equal to three times the lead width, and (ii) the number of leads is less than or equal to ten, preferably, less than or equal to five and, still more preferably, less than or equal to three.

According to another related aspect of the invention, the searched-for templates represent no more than one edge of each of the expected leads. For example, the method can use a pattern that represents the left-side edge of each lead, but not its right-side edge, its tip edge or its base edge. Such a pattern can be advantageously used with devices having fifty or fewer leads, thirty or fewer leads, between three and fifty leads, or between three and thirty leads. It can otherwise be advantageously used with devices whose leads are moderately spaced from one another, e.g., devices for which (i) the lead pitch is greater than or equal to three times the lead width, and (ii) the number of leads is less than or equal to fifty, preferably, less than or equal to thirty, still more preferably, between three and fifty, and yet still more preferably, between three and thirty.

By way of a further example, the method can use a template that represents the tip edge of each lead, but not its left or right side edges. Such a pattern can be advantageously used with devices having fifty or more leads or, preferably, one hundred or more leads. More particularly, the method can search for a template depicting the segmented line pattern, for example, effected by plural such tip edges. It can otherwise be advantageously used with devices whose leads are closely spaced to one another, e.g., devices for which the lead pitch is less than three times the lead width.

Methods according to the invention need not use templates depicting the entirety of the selected edges. Thus, for example, the patterns can represent portions at the "foot" or contact portion of the leads.

Moreover, the methods need not employ templates that depict all of the expected leads. For example, according to some aspects of the invention, templates are intended to match only end selected device leads, e.g., those at ends of groups of leads.

Yet still other aspects of the invention employ methods as described above in which the templates and/or searching step positively weight portions of the search pattern that match apparent lead at an expected position, yet negatively weight portions that match apparent at unexpected positions.

These and other aspects of the invention are evident in the drawings and in the description that follows.

BRIEF DESCRIPTION OF THE DRAWINGS

A further understanding of the invention may be attained by reference to the drawings, in which.

DETAILED DESCRIPTION OF THE ILLUSTRATED EMBODIMENT

Figure 1:
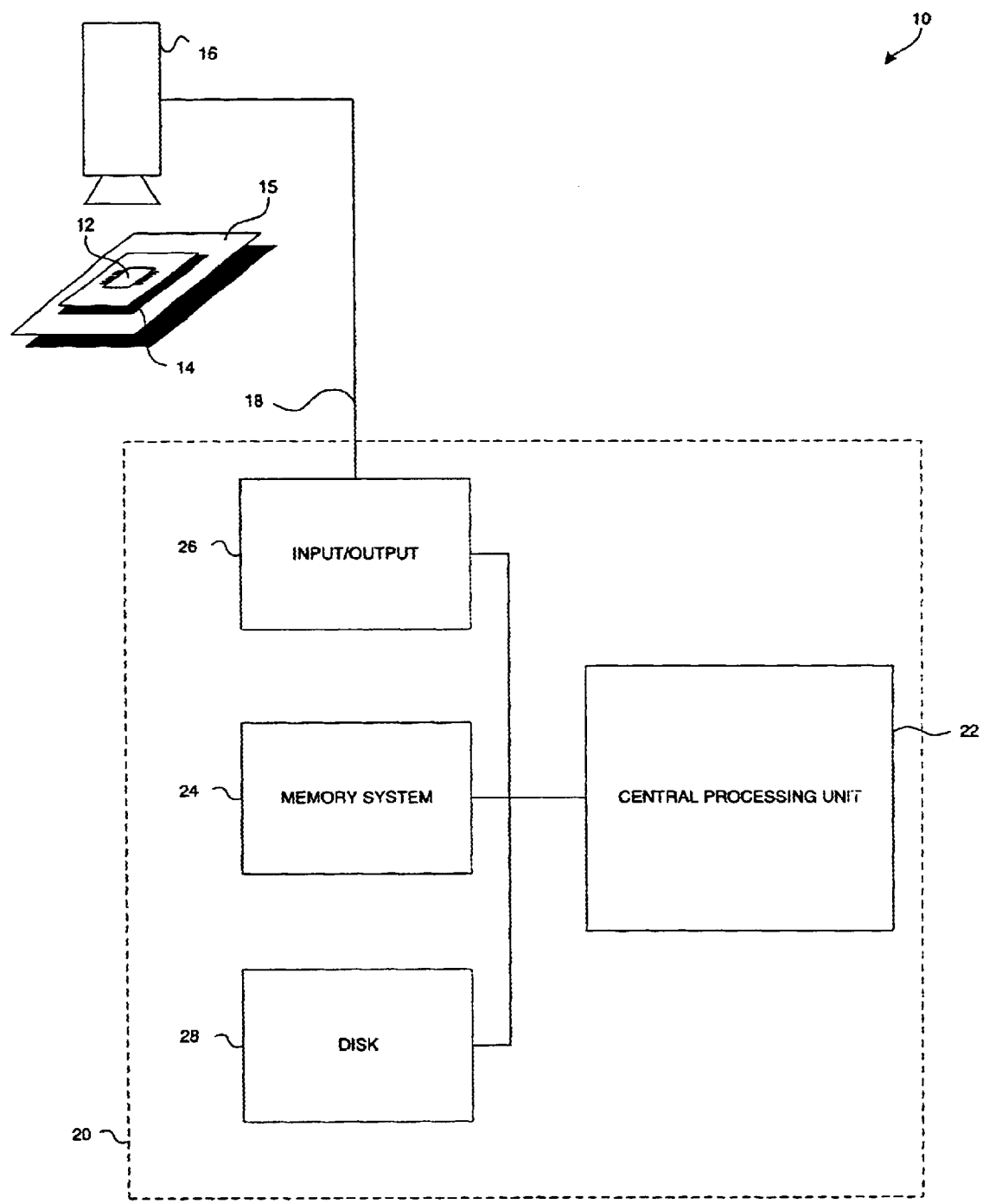
FIG. 1 depicts an image analysis system of the type used to practice the invention.

FIG. 1 depicts an image analysis system 10 according to the invention for inspection of leaded components. The system 10 includes an image capture device, e.g., camera 16, that generates an image of a scene including leaded electronic component 12. Digital image data (or pixels) generated by the capturing device 16 represents, in the conventional manner, the image contrast of each point in the field of view of the capturing device. The image acquisition device may be video camera, charge coupled display (CCD) device, or any other device suitable for imaging component 12. In the illustration, the component 12 is disposed on a platform 15 capable of translating and rotating the object, e.g., based on information determined by image analysis system 10 in connection with the mechanisms and techniques described herein.

Digital image data is transmitted from capturing device 16 via a communications path 18 to the image analysis system 20. This can be a conventional digital data processor, or a vision processing system of the type commercially available from the assignee hereof, Cognex Corporation, as programmed in accord with the teachings hereof for inspection of leaded component images, e.g., acquired by device 16. The image analysis system 20 may have one or more central processing units 22, main memory 24, input-output system 26, and disk drive (or other mass storage device) 28, all of the conventional type.

The system 10 and, more particularly, central processing unit 22, is configured by programming instructions according to teachings hereof for operation as further described and illustrated herein. Those skilled in the art will appreciate that, in addition to implementation on a programmable digital data processor, the methods taught herein can be implemented in special purpose hardware.

Figure 2:
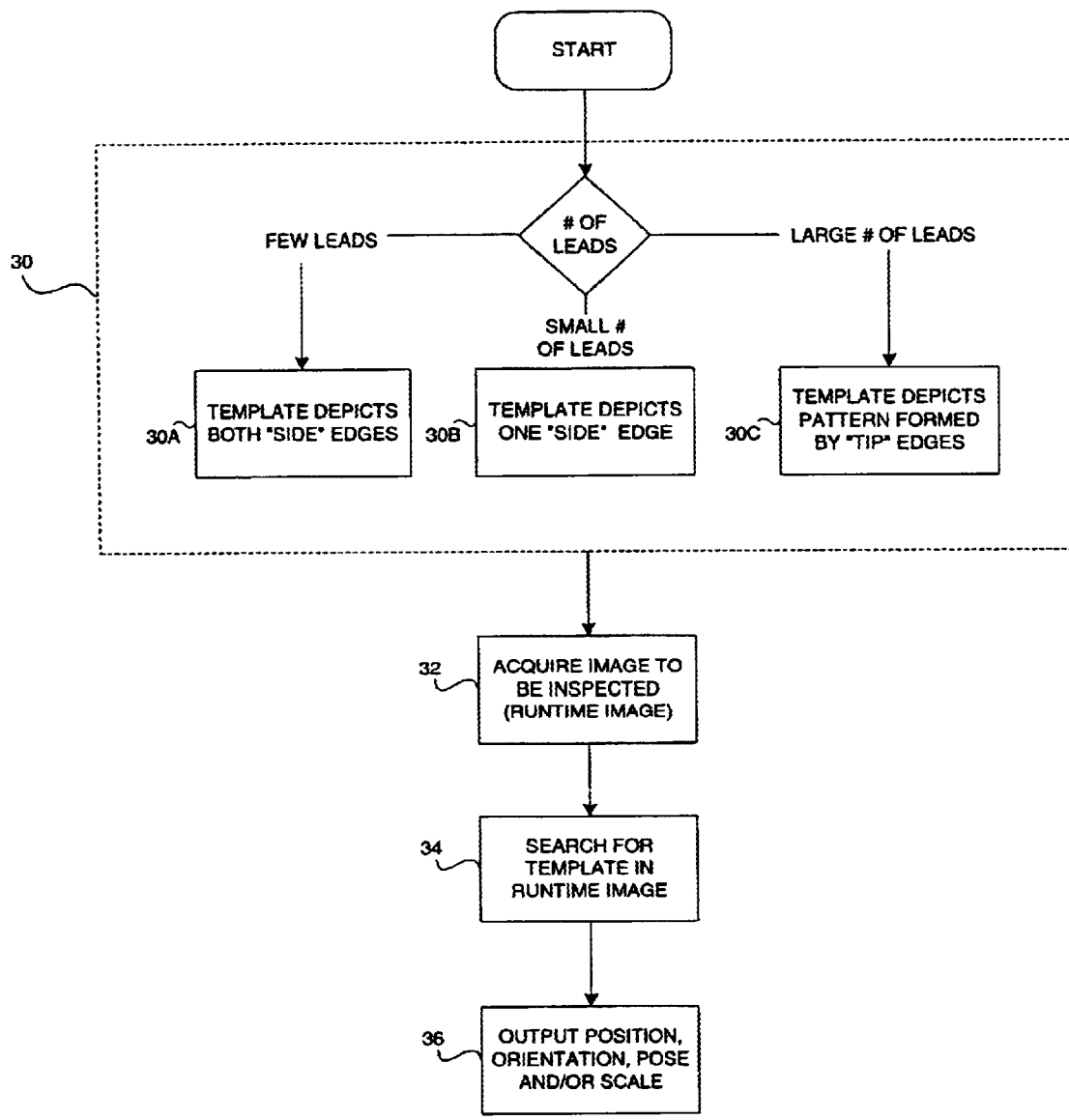
FIG. 2 depicts a method according to the invention for inspection of leaded electronic components.

FIG. 2 depicts a method according to one practice of the invention for inspection of leaded electronic components. In illustrated step 30, a template is generated depicting portions of expected leads on an electronic device to be inspected. The template can also represent unexpected leads or unexpected lead positions, as discussed below.

According to one practice of the invention, for a device with a "few" leads, e.g., ten or fewer leads, preferably, five or fewer leads or, still more preferably, three or fewer leads, the template generated in step 30 represents both "side" edges of each expected lead. See step 30A.

Figures 3A, 3B:
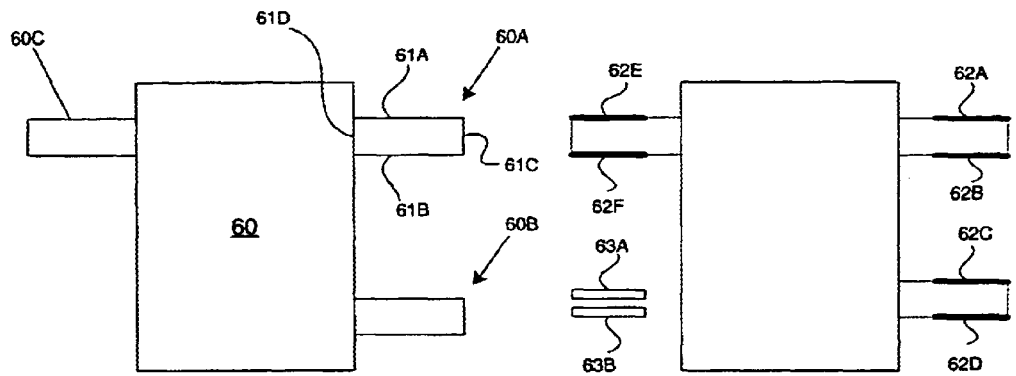
FIG. 3A depicts a component with few leads of the type amenable for inspection by a method according to the invention.
FIG. 3B depicts a template used in a method according to the invention to locate a component of the type shown in FIG. 3A.

FIG. 3A depicts an exemplary such device, particularly, an electrical component 60 with three leads 60A–60C. Each lead includes two side edges 61A, 61B that extend outwardly from (and are generally oriented parallel to the normals of) corresponding sides of the component's body. Each lead also includes a tip edge 61C and a base edge 61D that are generally oriented parallel to the corresponding sides of the component's body. Those skilled in the art will appreciate that orientations of side, tip and base edges of any given device may vary from that shown in the drawing (or the drawings that follow).

FIG. 3B depicts a template of the type utilized by the invention in order to inspect an image of such a component. In that drawing, the template is depicted with solid lines. Those skilled in the art will appreciate that the thickness of those lines is exaggerated for purposes of illustration and is not necessarily indicative of the thickness required for practice of the invention. Indeed, in alternate embodiments, the solid lines represent images or patterns depicting background/lead boundary transitions of the type expected in runtime images. Dashed lines are utilized in FIG. 3B to illustrate the component 60 and its leads 60A–60C and, thereby, to illustrate their relationships to the template.

In the drawing, the template has portions 62A–62F, which correspond to side edges of the leads 60A–60C, as shown. The template can represent the entirety of each side edge that is expected to be discernable on images that will ultimately be inspected ("runtime" images), though, preferably, it represents a portion of each such edge. That portion can be in the region of the foot (i.e., contact portion) of the respective expected lead, as shown.

The template can include portions 63A, 63B representing unexpected leads or unexpected lead positions. In the illustration those portions 63A, 63B represent an unexpected fourth lead. As described below, when the template is compared against a runtime image, matches with expected portions 62A–62F are positively weighted, while those with unexpected portions 63A, 63B are negatively weighted.

Referring back to FIG. 2, for a device with a small number of leads, e.g., fifty or fewer leads, still more preferably, thirty or few leads and, yet still more preferably, between three and thirty (or fifty) leads, the template generated in step 30 represents a single side edge (e.g., a "left" or "right" side edge) of each expected lead. See step 30B.

Figures 4A, 4B:
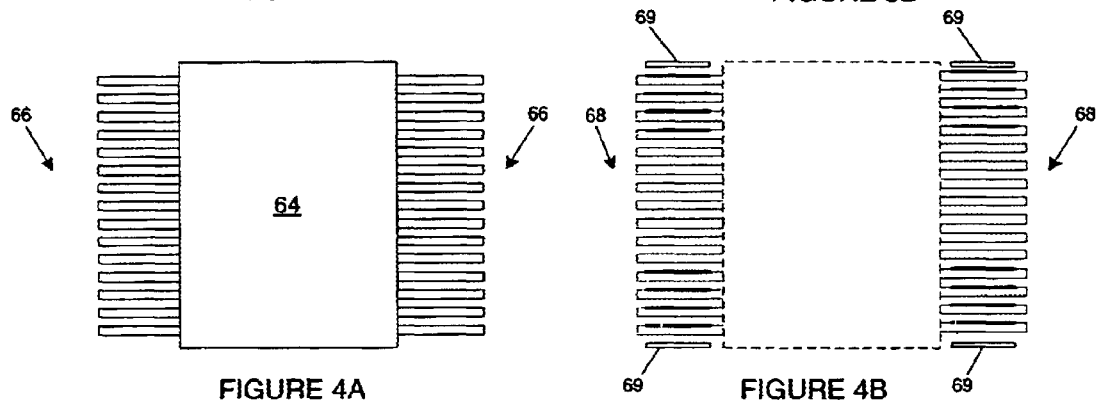
FIG. 4A depicts a component with a small number of leads of the type amenable for inspection by a method according to the invention.
FIG. 4B depicts a template used in a method according to the invention to locate a component of the type shown in FIG. 4A.

FIG. 4A depicts an exemplary such device, particularly, an electrical component 64 with thirty leads 66. As above, each lead includes two side edges, a tip edge and a base edge. Again, those skilled in the art will appreciate that orientations of side, tip and base edges of any given device may vary from that shown in the drawing.

FIG. 4B depicts a template of the type utilized by the invention in order to inspect an image of such a component. As above, solid lines are used to show the template, while dashed lines are used to show the component 74 and its leads 66. In the drawing, the template has portions 68 that correspond to a single side edge of each of the leads 66. Again, those portions can represent the entirety of the expected discernable lead of each side edge or a part thereof.

Though portions 68 can be provided for each lead 66, in the illustrated embodiment they are only provided for selected leads—here, those the ends of each lead group. It will be appreciated, of course, that other such leads may be selected for this purpose. Moreover, though illustrated portions 68 are provided for leads on both sides of the device 66, alternate embodiments may provide templates that match leads on only one side.

The template shown in FIG. 4B also has portions 69 representing unexpected leads or, perhaps more accurately, unexpected lead positions. These portions 69 are used to insure proper alignment of the expected portions 68 and can be negatively weighted during the searching step to increase the likelihood of correct matching.

Referring back to FIG. 2, for a device with a large number of leads, e.g., thirty or more leads, preferably, fifty or more leads, and still more preferably, one hundred or more leads, the template generated in step 30 is a pattern depicting the segmented line (or other configuration) represented by the tip edges of the leads. See step 30C.

Figures 5A, 5B:
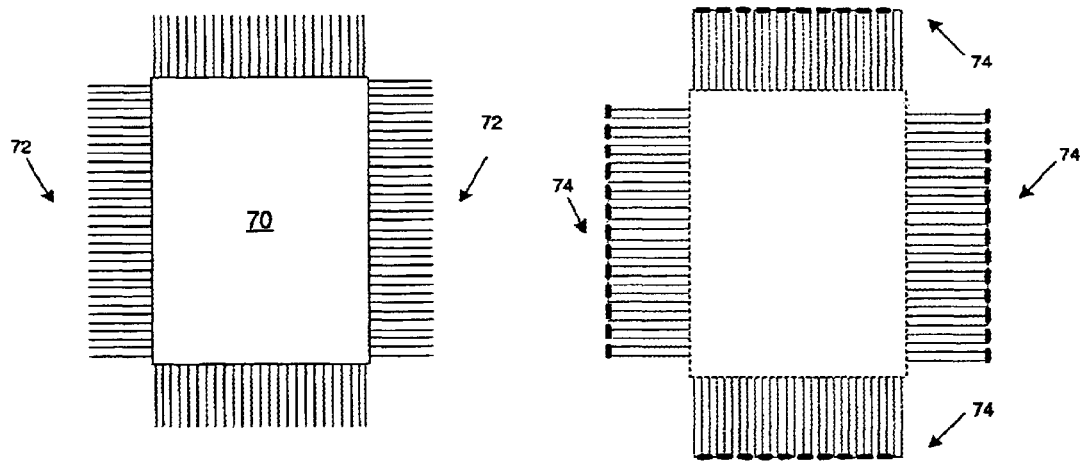
FIG. 5A depicts a component with a large number of leads of the type amenable for inspection by a method according to the invention.
FIG. 5B depicts a template used in a method according to the invention to locate a component of the type shown in FIG. 5A.

FIG. 5A depicts an exemplary such device, particularly, an electrical component 70 with over one hundred leads 72. As above, each lead includes two side edges, a tip edge and a base edge. Again, those skilled in the art will appreciate that orientations of side, tip and base edges of any given device may vary from that shown in the drawing.

FIG. 5B depicts a template of the type utilized by the invention in order to inspect an image of such a component. Thick dashed lines are used to show the template, while thin dashed lines are used to show the component 70 and its leads 72. The template has portions 74 that correspond to the pattern formed by the tip edges of the leads 72. Here, that pattern is a dashed line. Though the pattern can extend over all leads 72, as illustrated, it can also cover only selected leads, e.g., those at the ends of each lead group. As above, the template can also include portions representing unexpected leads or lead positions, though no such portions are shown in FIG. 5B.

With continued reference to step 30 of FIG. 2, the template can be generated from an image of a model or sample component to be inspected. Thus, for example, an image of the model component can be acquired and portions representing all but expected template portions 62A–62F, 68, 74 can be masked out. Alternatively, such a template can be generated from a geometric description of a sample component or its leads. Though the templates shown in FIGS. 3B, 4B, 5B include multiple portions that are intended to match multiple expected (or unexpected) leads, alternate embodiments utilize templates depicting only one lead.

Template portions 63A–63B, 69 representing unexpected leads or lead positions can be generated via image manipulation, from geometric descriptions, or otherwise. Depending on the search methodology to be used, portions of the template representing expected leads can be marked for positive weighting. Those representing unexpected leads or positions can be marked for negative weighting.

Templates generated in step 30 can be in image form or in other forms suitable for use in search step 34. Where appropriate, such other forms can include algorithmic or geometric representations.

In step 32, the runtime image to be inspected is acquired. This can be accomplished in any manner known in the art, though, it typically involves real-time imaging of a circuit board or other component assembly. Such an image can be filtered or other preprocessed in the conventional manner known in the art.

In step 34, the template is matched against the runtime image. This can be accomplished in any conventional manner known in the art. In the case of templates that do not incorporate portions 63A–63B, 69 representing unexpected leads or unexpected lead positions, a conventional machine vision search technique can be used. Other techniques seeking a best correlation between a template and an image can also be used.

In the case of templates that do incorporate portions 63A–63B, 69 representing unexpected leads or unexpected lead positions, a search or other related technique is used that positively scores matches between portions 62A–62F, 68, 74 representing expected leads, while negatively scoring matches between portions 63A–63B, 69 representing unexpected leads or lead positions. Such search techniques are known in the art and/or the ken of those of ordinary skill in the art.

In embodiments that utilize a template representing a single lead (or fewer that all leads) of a component under inspection, step 34 can match that template repeatedly against the runtime image, noting the positions of best correlation. Those positions can be compared with a algorithmic, geometric or other representation of expected and unexpected lead positions, with positive and negative weightings applied accordingly.

In step 36, the method outputs the location (i.e., position, orientation, pose and/or scale) determined in step 34. This information can be used by other machine vision applications, e.g., for purposes of more exacting analysis of the runtime image and/or for placement of the component depicted therein.

Described above are methods meeting the objectives set forth previously. Those skilled in the art will appreciate that the illustrated embodiment is merely an example of the invention, and that other embodiments incorporating changes thereto fall within the scope of the invention. By way of non-limiting example, it will be appreciated that the template-generating step (step 30) can be "combined" with the search step (step 34), e.g., in instances where the template represents a single lead that is matched against the runtime image at positively-weighted expected locations and, optionally, negatively-weighted unexpected locations.

In view of the foregoing, what we claim is:

1. A machine vision method of locating a leaded electronic device in an image, the method comprising the steps of
searching the image with a template representing a portion of each of one of more leads, each portion constituting less than an entirety of the respective lead,
the searching step including
positively weighting a portion represented in the template that matches an apparent lead at an expected position,
negatively weighting a portion represented in the template that matches an apparent lead at an unexpected position, determining a location, if any, of any of a lead and the device based on results of the searching step.

2. The method of claim 1, wherein the template represents no more than two edges of each represented lead.

3. The method of claim 1, wherein the template represents no more than one edge of each represented lead.

4. The method of any of claims 2–3, wherein the template represents side edges of each represented lead.

5. The method of any of claims 1–3, wherein the template represents at least a portion of a foot of each represented lead.

6. The method of claim 1, comprising the step of generating the template from a training image.

7. The method of claim 1, comprising the step of generating the template from a training image from a geometric description of any of the device and the expected leads.

8. A machine vision method of locating a leaded electronic device in an image, the method comprising the steps of
generating, from any of a training image and a geometric description, a template representing a portion of each of one of more leads, each portion constituting no more than two edges of each of the expected leads,
searching the image with the template,
the searching step including
positively weighting a portion represented in the template that matches an apparent lead at an expected position,
negatively weighting a portion represented in the template that matches an apparent lead an unexpected position,
determining a location, if any, of any of a lead and the device based on results of the searching step.

9. The method of claim 8, wherein the generating step includes generating the template to represent no more than one edge of each of the represented leads.

10. The method of any of claims 8–9, wherein the generating step includes generating the template to represent at least a portion of a foot of each of the represented leads.

11. A machine vision method of locating a leaded electronic device in an image, the method comprising the steps of:
determining a position in the image of not more than two side edges of each of one or more expected leads of the electronic device,
determining a location, if any, of the device in the image based on positions of the side edges of each of the one of more expected leads, wherein the step of determining the location, if any, of the device in the image includes:
searching the image with a template representing a portion of one or more leads, each portion comprising not more than two side edges of each one or more of the respective lead, the searching step including:
positively weighting a portion represented in the template that matches an apparent lead at an expected position, and
negatively weighting a portion represented in the template that matches an apparent lead an unexpected position.

12. The method of claim 11 adapted for use in locating in an image a leaded electronic device having leads that are substantially spaced from one another.

13. The method of claim 12 adapted for use in locating in an image an electronic device having ten or fewer leads.

14. The method of claim 12 adapted for use in locating in an image an electronic device having five or fewer leads.

15. The method of claim 12 adapted for use in locating in an image an electronic device having three or fewer leads.

16. The method of claim 11, comprising the step of generating the template from a training image.

17. The method of claim 11, comprising the step of generating the template from a training image from a geometric description of any of the device and the expected leads.

18. A machine vision method of locating a leaded electronic device in an image, the method comprising the steps of:
determining a position in the image of not more than one side edges of each of one or more expected leads of the electronic device,
determining a location, if any, of the device in the image based on positions of the side edges of each of the one of more expected leads, wherein the step of determining the location, if any, of the device in the image includes:
searching the image with a template representing a portion of one or more leads, each portion comprising not more than one side edge of each respective lead, the searching step including:
positively weighting a portion represented in the template that matches an apparent lead at an expected position, and
negatively weighting a portion represented in the template that matches an apparent lead an unexpected position.

19. A machine vision method of locating a leaded electronic device in an image, the method comprising the steps of:
determining a position in the image of not more than one side edge of each of one or more expected leads of the electronic device,
determining a location, if any, of the device in the image based on positions of the side edges of each of the one of more expected leads, wherein the step of determining the location, if any, of the device in the image includes:
searching the image with a template representing the aforesaid side edge of each of one or more of the expected leads, the searching step including:
positively weighting a portion represented in the template that matches an apparent lead at an expected position, and
negatively weighting a portion represented in the template that matches an apparent lead an unexpected position.

20. The method of claim 19 adapted for use in locating in an image an electronic device having one hundred or fewer leads.

21. The method of claim 19 adapted for use in locating in an image an electronic device having fifty or fewer leads.

22. The method of claim 19 adapted for use in locating in an image an electronic device having between three and fifty leads.

23. The method of claim 19 adapted for use in locating in an image an electronic device having thirty or fewer leads.

24. The method of claim 19 adapted for use in locating in an image an electronic device having between three and thirty leads.

25. The method of claim 19, comprising the step of generating the template from a training image.

26. The method of claim 19, comprising the step of generating the template from a training image from a geometric description of any of the device and the expected leads.

27. A machine vision method of locating a leaded electronic device in an image, the method comprising the steps of:
- determining a position in the image of not more than one tip edge of each of plural expected leads of the electronic device,
- determining a location, if any, of the device in the image based on positions of the tip edges of each of the plural expected leads, wherein the step of determining the location, if any, of the device in the image includes:
- searching the image with a template representing a portion of plural leads, each portion comprising not more than one tip edge of each respective lead, the searching step including:
  - positively weighting a portion represented in the template that matches an apparent lead at an expected position, and
  - negatively weighting a portion represented in the template that matches an apparent lead an unexpected position.

28. A machine vision method of locating a leaded electronic device in an image, the method comprising the steps of:
- determining a position in the image of not more than one tip edge of each of plural expected leads of the electronic device,
- determining a location, if any, of the device in the image based on positions of the tip edges of each of the plural expected leads, wherein the step of determining the location, if any, of the device in the image includes:
- searching the image with a template representing the aforesaid tip edge of each of one or more of the expected leads, searching step including:
  - positively weighting a portion represented in the template that matches an apparent lead at an expected position, and
  - negatively weighting a portion represented in the template that matches an apparent lead an unexpected position.

29. The method of claim 28 adapted for use in locating in an image an electronic device having thirty or more leads.

30. The method of claim 28 adapted for use in locating in an image an electronic device having fifty or more leads.

31. The method of claim 28 adapted for use in locating in an image an electronic device having one hundred or more leads.

32. The method of claim 28, comprising the step of generating the template from a training image.

33. The method of claim 28, comprising the step of generating the template from a training image from a geometric description of any of the device and the expected leads.

* * * * *